United States Patent
Law et al.

(10) Patent No.: US 7,587,020 B2
(45) Date of Patent: Sep. 8, 2009

(54) HIGH PERFORMANCE, LOW POWER, DYNAMICALLY LATCHED UP/DOWN COUNTER

(75) Inventors: Jethro C. Law, Austin, TX (US); Trong V. Luong, Austin, TX (US); Hung C. Ngo, Austin, TX (US); Peter J. Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 11/739,756

(22) Filed: Apr. 25, 2007

(65) Prior Publication Data

US 2008/0267341 A1  Oct. 30, 2008

(51) Int. Cl.
*H03K 25/00* (2006.01)
*H03K 23/50* (2006.01)

(52) U.S. Cl. .................. 377/94; 377/119; 377/124

(58) Field of Classification Search .......... None
See application file for complete search history.

(56) References Cited

U.S. PATENT DOCUMENTS

| | | | | |
|---|---|---|---|---|
| 3,636,376 A | | 1/1972 | Hoffmann | 307/221 |
| 4,224,530 A | | 9/1980 | Simcoe et al. | 307/141 |
| 4,580,137 A | | 4/1986 | Fiedler et al. | 340/825.68 |
| 4,637,038 A | | 1/1987 | Boyle | 377/117 |
| 4,749,628 A | * | 6/1988 | Ahlert et al. | 428/660 |
| 5,210,776 A | * | 5/1993 | Kim et al. | 377/17 |
| 5,291,534 A | * | 3/1994 | Sakurai et al. | 377/20 |
| 5,537,121 A | * | 7/1996 | Lennen | 342/357.12 |
| 5,710,379 A | * | 1/1998 | Brown | 73/861.28 |
| 5,881,067 A | | 3/1999 | Narayanan et al. | 371/22.31 |
| 5,905,406 A | * | 5/1999 | Sugden et al. | 329/312 |
| 6,026,140 A | | 2/2000 | Owen | 377/51 |
| 7,277,510 B1 | * | 10/2007 | Kilani et al. | 375/345 |
| 2003/0038659 A1 | | 2/2003 | Takahashi et al. | 327/141 |
| 2005/0177338 A1 | * | 8/2005 | Takeuchi et al. | 702/163 |

OTHER PUBLICATIONS

"Computer Engineering Hardware Design" by M. Morris Mano, pp. 120-122; 166-176, 1988.*

* cited by examiner

*Primary Examiner*—Tuan Lam
(74) *Attorney, Agent, or Firm*—Hamilton & Terrile, LLP; Stephen A. Terrile

(57) ABSTRACT

A high performance, low power up/down counter is set forth. The counter presented is controlled by two clock pulses, an up pulse and a down pulse, and updates all bits of the counter in parallel. These bits are then latched using a scannable pulsed limited output switching dynamic logic latch. By using a limited switch dynamic logic latch, the counter is able to utilize the speed of dynamic logic without requiring the traditional dynamic logic power. The area saved and speed gained by using a dynamic latch is significant compared to a typical edge-triggered flip-flop. Additionally, by computing all the next count state bits in parallel, the counter reduces an overall count computation delay by eliminating the counter ripple.

14 Claims, 10 Drawing Sheets up c7* = c7'

*Figure 3A* up c6* = ·(c6·c7'+c6'·c7)

*Figure 3B* up c5* = ·(c5·w0+c5'·x0)
where: w0=c6'+c7'; x0=c6·c7

*Figure 3C* up c4* = ·(c4·w1+c4'·x1)
where: w1=c5 '+w0, x1=c5·x0

*Figure 3D* up $c3^* = (c3 \cdot w22 + c3' \cdot x2)$
where: $w2 = c4' + w1$, $x2 = c4 \cdot x1$

Figure 3E up $c2^* = (c2 \cdot w3 + c2' \cdot x3)$
where: $w3 = c3' + w2$, $x3 = c3 \cdot x2$

Figure 3F up $c1^* = (c1 \cdot w4 + c1' \cdot x4)$
where: $w4 = c2' + w3$, $x4 = c2 \cdot x3$

Figure 3G up $c0^* = (c0 \cdot w5 + c0' \cdot x5)$
where: $w5 = c1' + w4$, $x5 = c1 \cdot x4$

Figure 3H down c7* = c7'

Figure 4A down c6* = (c6·c7+c6'·c7')

Figure 4B down c5* = (c5·y0+c5'·z0)
where: y0=c6+c7, z0=c6'·c7'

Figure 4C down c4* = (c4·y1+c4'·z1)
where: y1=c5+y0, z1=c5'·z0

Figure 4D down c3* = (c3·y2+c3'·z2)
where: $y2=c4+y1$, $z2=c4'·z1$

Figure 4E down c2* = (c2·y3+c2'·z3)
where: $y3=c3+y2$, $z3=c3'·z2$

Figure 4F down c1* = (c1·y4+c1'·z4)
where: $y4=c2+y3$, $z4=c2'·z3$

Figure 4G down c0* = (c0·y5+c0'·z5)
where: $y5=c1+y4$, $z5=c1'·z4$

$$c6^* = up \cdot (c6 \cdot c7' + c6' \cdot c7) + dn \cdot (c6 \cdot 67 + c6' \cdot c7')$$

Figure 7B

$$c5^* = up \cdot (c5 \cdot w0 + c5' \cdot x0) + dn \cdot (c5 \cdot y0 + c5' \cdot z0)$$
where: $w0 = c6' + c7$; $x0 = c6 \cdot c7$, $y0 = c6 + c7$, $z0 = c6' \cdot c7'$

Figure 7C

$$c4^* = up \cdot (c4 \cdot w1 + c4' \cdot x1) + dn \cdot (c4' \cdot y1 + c4 \cdot z1)$$
where: $w1 = c5' + w0$, $x1 = c5 \cdot x0$, $y1 = c5 + y0$, $z1 = c5' \cdot z0$

Figure 7D

$$c3^* = up \cdot (c3 \cdot w2 + c3' \cdot x2) + dn \cdot (c3 \cdot y2 + c3' \cdot z2)$$
*where: w2=c4'+w1, x2=c4·x1, y2=c4+y1, z2=c4'·z1*

Figure 7E $$c2^* = up \cdot (c2 \cdot w3 + c2' \cdot x3) + dn(c2 \cdot y3 + c2' \cdot z3)$$
*where: w3=c3'+w2, x3=c3·x2, y3=c3+y2, z3=c3'·z2*

Figure 7F $$c1^* = up \cdot (c1 \cdot w4 + c1' \cdot x4) + dn(c1 \cdot y4 + c1' \cdot z4)$$
*where: w4=c2'+w3, x4=c2·x3, y4=c2+y3, z4=c2'·z3*

Figure 7G $$c0^* = up \cdot (c0 \cdot w5 + c0' \cdot x5) + dn \cdot (c0 \cdot y5 + c0' \cdot z5)$$
*where: w5=c1'+w4, x5=c1·x4, y5=c1+y4, z5=c1'·z4*

Figure 7H ial component used in many applications, for example, statistics collections circuits, down-sampling circuits, and clock-data-recovery circuits in various communications channels. One conventional approach to achieve a high-speed counter is to partition a synchronous N-bit counter into multiple smaller counters (sub-counter blocks) in a pipeline fashion. Each sub-counter block is supplied with a clock signal which is gated by a control signal. Such a control signal is typically generated using an adjacent less-significant block so as to reduce power consumption. However, such an approach often requires more complex circuitry because of the gated clock overhead, and also consumes more power than an asynchronous approach.

HIGH PERFORMANCE, LOW POWER, DYNAMICALLY LATCHED UP/DOWN COUNTER

BACKGROUND OF THE INVENTION

1. Field of the Invention

The present invention relates to counters and more particularly to dynamically latched up/down counters.

2. Description of the Related Art

A high-speed, low power up/down counter is a fundamental component used in many applications, for example, statistics collections circuits, down-sampling circuits, and clock-data-recovery circuits in various communications channels. One conventional approach to achieve a high-speed counter is to partition a synchronous N-bit counter into multiple smaller counters (sub-counter blocks) in a pipeline fashion. Each sub-counter block is supplied with a clock signal which is gated by a control signal. Such a control signal is typically generated using an adjacent less-significant block so as to reduce power consumption. However, such an approach often requires more complex circuitry because of the gated clock overhead, and also consumes more power than an asynchronous approach.

Another known approach is to build an asynchronous (or ripple) counter. Ripple counters are especially useful in applications in which latency is not an issue. In a ripple counter an output of a flip-flop at the n-th bit position is connected to the clock input of a flip-flop at the (n+1)th bit position. Positive edge-triggered flip-flops are used for a down counter, and negative edge-triggered flip-flops are used for an up counter. However, known ripple counters can not count both up and down.

Many known counter designs only count up or down given an input stimulus, typically the system clock. These designs focus on making the fastest counters possible. A few solutions optimize the serial counter while others try to bypass the ripple generation.

Other known counter designs include up/down counters. These counters often require at least two inputs (up or down, among others) to count. One known up/down counter solution implements the counting serially. One possible disadvantage of a serial counter relates to the carry propagation delay when generating a count. The larger the counter (i.e., the more bits generated by the counter), the longer the total delay of the counter.

Accordingly, it would be desirable to provide an up/down counter that is both high performance and low power.

SUMMARY

In accordance with the present invention, a high performance, low power up/down counter is set forth. The counter presented is controlled by two clock pulses, an up pulse and a down pulse, and updates all bits of the counter in parallel. These bits are then latched using a scannable pulsed limited output switching dynamic logic latch. By using a limited switch dynamic logic latch, the counter is able to utilize the speed of dynamic logic without requiring the traditional dynamic logic power. The area saved and speed gained by using a dynamic latch is significant compared to a typical edge-triggered flip-flop. Additionally, by computing all the next count state bits in parallel, the counter reduces an overall count computation delay by eliminating the counter ripple.

In one embodiment, the invention relates to a counter which includes a next count circuit that generates a parallel next count signal based upon a present count value, and a latch circuit that latches the parallel next count signal based upon whether an up count indication or a down count indication is received by the next count circuit.

In another embodiment, the invention relates to a method for generating a count which includes generating a parallel next count signal based upon a present count value, and latching the parallel next count signal based upon whether an up count indication or a down count indication is received by the next count circuit.

In another embodiment, the invention relates to a counter which includes a parallel next count circuit and a latch circuit. The parallel next count circuit includes a plurality of bit counter circuits and each of the plurality of bit counter circuits generates a bit of a parallel next count signal in parallel. The latch circuit includes a plurality of bit latches and each of the plurality of bit latches then latches a bit of the parallel next count signal in parallel.

BRIEF DESCRIPTION OF THE DRAWINGS

Selected embodiments of the present invention may be understood, and its numerous objects, features and advantages obtained, when the following detailed description is considered in conjunction with the following drawings, in which:

FIGS. 3A-3H show the combinatorial equations used for implementing respective bits of a next up count circuit.

FIGS. 4A-4H show the combinatorial equations used for implementing respective bits of a next down count circuit.

FIGS. 7A-7H show combinatorial equations used for implementing respective bits of an alternate next count circuit.

DETAILED DESCRIPTION

Figure 1:
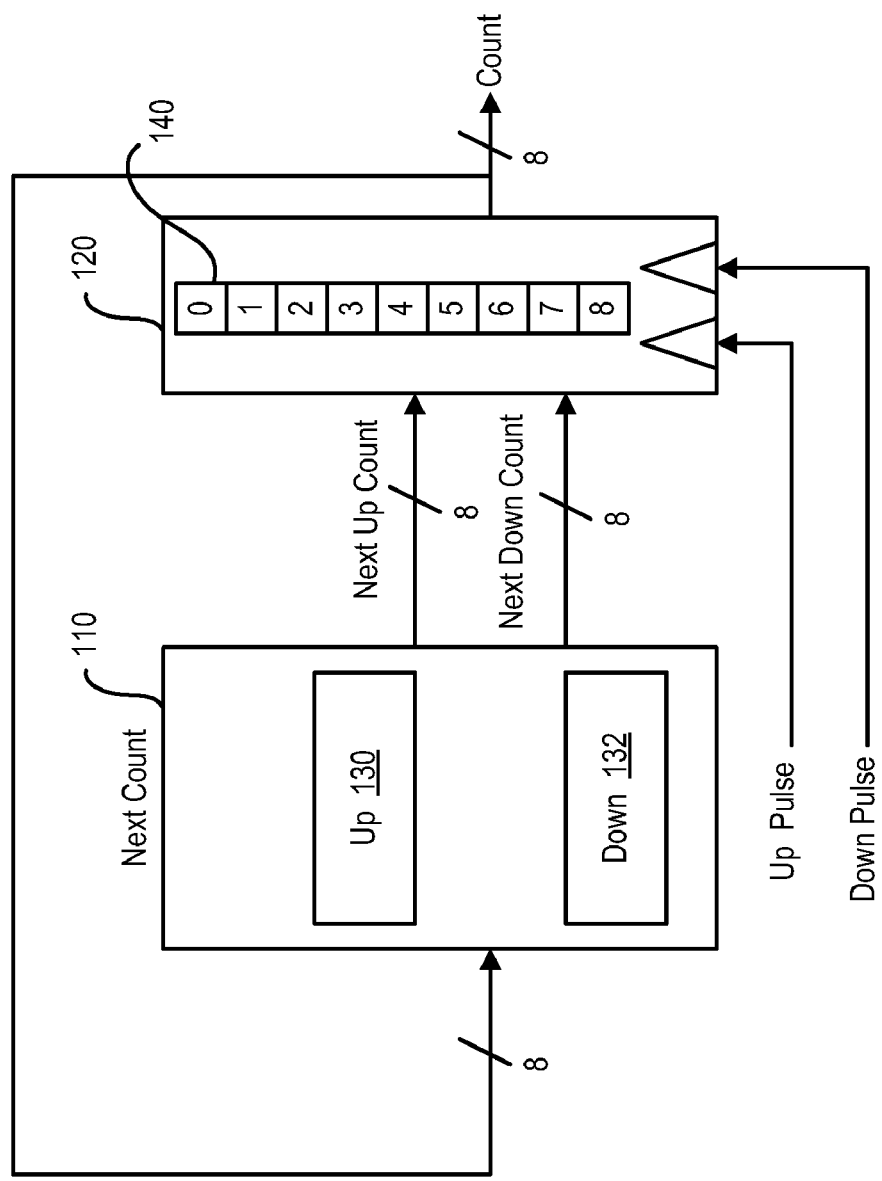
FIG. 1 shows a schematic block diagram of a counter in accordance with the present invention.

Referring to FIG. 1 a schematic block diagram of a high performance dynamically latched up/down counter 100 is shown. The counter includes a next count circuit 110 and a latch circuit 120. The next count circuit 110 includes a next up count circuit 130 and a next down count circuit 132. The dynamic latch circuit 120 includes a plurality of bit latches 140.

The next count circuit 110 generates a parallel next count signal. The next count signal includes a parallel next up count signal and a parallel next down count signal generated by the next up count circuit 130 and the next down count circuit 132, respectively. The dynamic latch 120 latches the next count signal to provide a next count upon receipt of an up pulse or a down pulse. More specifically, the latch circuit 120 includes a plurality of bit latches 140 corresponding to the width of the parallel next count signal. Each of the plurality of bit latches latch a bit of the next count signal upon receipt of an up pulse or a down pulse. In one embodiment, the next count circuit generates an 8-bit count signal and the dynamic latch circuit latches the next count signal based upon either an up pulse or a down pulse. The next count circuit 110 and the dynamic latch circuit 120 can be configured to produce count signals having more bits (e.g., 16, 32 bits, etc).

The counter 100 is controlled by two clock pulses, an up pulse (UP PULSE) (e.g., an up count indication) and a down pulse (DOWN PULSE) (e.g., a down count indication), and updates all bits of the bits within the count signal in parallel. The next up bits and next down bits generated by the next count circuit 110 are latched using a Level sensitive scan design/general scan design (LSSD/GSD) type scannable pulsed limited output switching dynamic logic latch. By using a limited switch dynamic logic latch, the counter is able to utilize the speed of dynamic logic without requiring the traditional dynamic logic power. The area saved and speed gained by using a dynamic latch is significant compared to a typical edge-triggered flip-flop. Additionally, by computing all the next count state bits in parallel, the counter reduces an overall count computation delay by eliminating the counter ripple.

Figure 2:
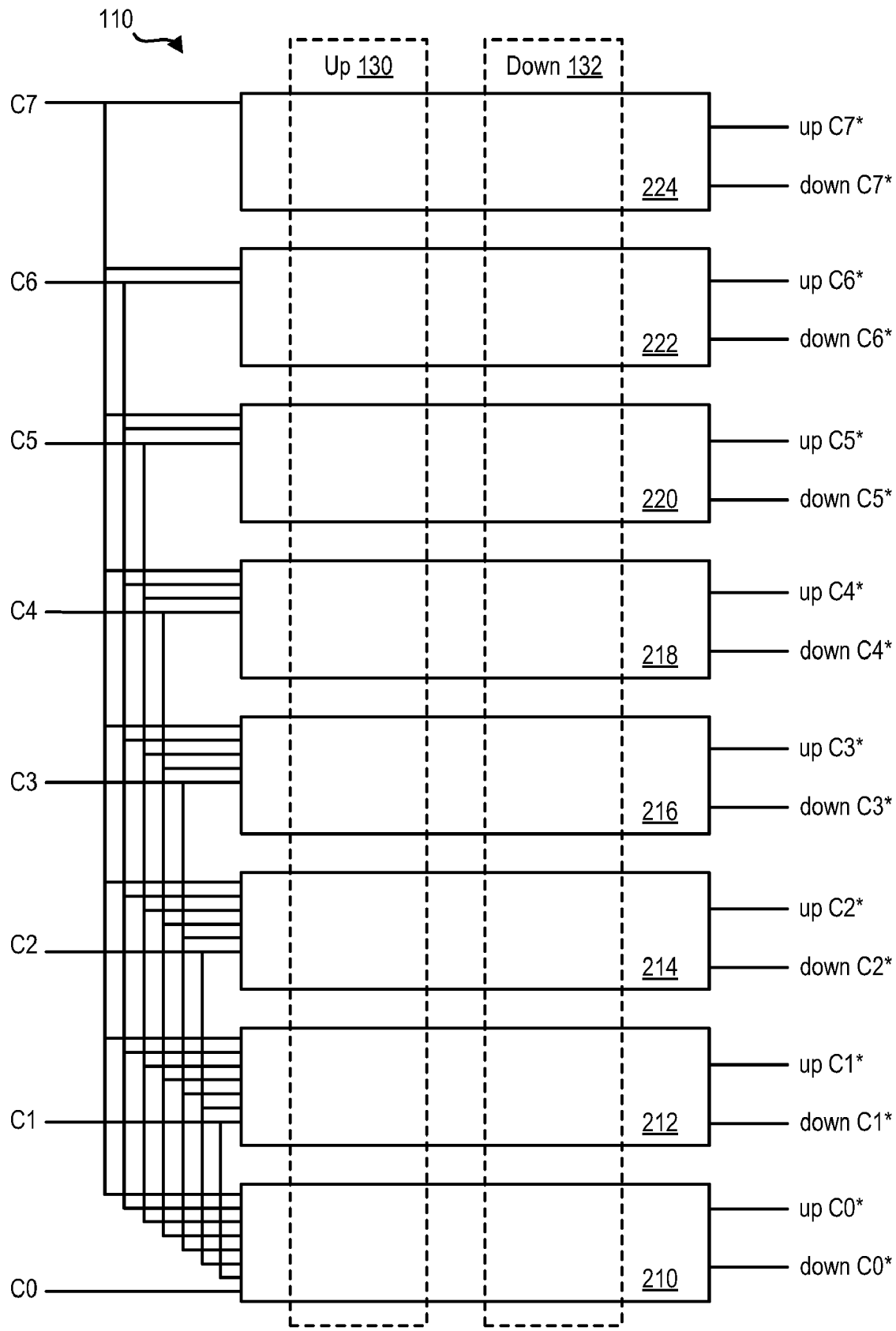
FIG. 2 shows a schematic block diagram of a parallel up down next count circuit.

Referring to FIG. 2, a schematic block diagram of a parallel next count circuit 110 is shown. Each of the bits of the next count signal is computed in parallel, similar in function to a carry look ahead adder. The parallel next count circuit receives an 8 bit present count signal and generates an 8 bit up count signal and an 8 bit down count signal based upon the 8 bit present count signal.

More specifically, the parallel next count circuit 110 includes a bit 0 counter circuit 210, a bit 1 counter circuit 212, a bit 2 counter circuit 214, a bit 3 counter circuit 216, a bit 4 counter circuit 218, a bit 5 counter circuit 220, a bit 6 counter circuit 222 and a bit 7 counter circuit 224. The Bit 7 circuit 224 generates the least significant bits of the up and down count signals, the bit 6 counter circuit 222 generates the next more significant bits of the up and down count signals, the bit 5 counter circuit 220 generates the next more significant bits of the up and down count signals and so on with the bit 0 counter circuit 210 generating the most significant bits of the up and down count signals.

Portions of each of the bit 0-bit 7 counter circuits combine to provide the next up count circuit 130 and the next down count circuit 132.

The bit 7 counter circuit 224 receives bit 7 of the present count signal (c7) and generates bit 7 of a next up count signal (up c7*) and bit 7 of a next down count signal (down C7*). The bit 6 counter circuit 222 receives bits 7 and 6 of a present count signal (c7 and c6) and generates bit 6 of a next up count signal (up c6*) and bit 6 of a next down count signal (down C6*). The bit 5 counter circuit 220 receives bits 7, 6 and 5 of the present count signal (c7, c6 and c5) and generates bit 5 of a next up count signal (up c5*) and bit 5 of a next down count signal (down C5*). The bit 4 counter circuit 218 receives bits 7, 6, 5, and 4 of the present count signal (c7, c6, c5 and c4) and generates bit 4 of a next up count signal (up c4*) and bit 4 of a next down count signal (down C4*). The bit 3 counter circuit 216 receives bits 7, 6, 5, 4, and 3 of the present count signal (c7, c6, c5, c4 and c3) and generates bit 3 of a next up count signal (up c3*) and bit 3 of a next down count signal (down C3*). The bit 2 counter circuit 214 receives bits 7, 6, 5, 4, 3 and 2 of the present count signal (c7, c6, c5, c4, c3 and c2) and generates bit 2 of a next up count signal (up c2*) and bit 2 of a next down count signal (down C2*). The bit 1 counter circuit 212 receives bits 7, 6, 5, 4, 3, 2 and 1 of the present count signal (c7, c6, c5, c4, c3, c2 and c1) and generates bit 1 of a next up count signal (up c1*) and bit 1 of a next down count signal (down C1*). The bit 0 counter circuit 210 receives bits 7, 6, 5, 4, 3, 2, 1 and 0 of the present count signal (c7, c6, c5, c4, c3, c2, c1 and c0) and generates bit 0 of a next up count signal (up c0*) and bit 0 of a next down count signal (down C0*).

Referring to FIGS. 3A-3H, the combinatorial equations for implementing respective bits of the next up count circuit 130 are shown. By using the counter bits generated by these combinatorial equations, the counter 100 uses the current state of the counter along with the up clock pulse to generate a new count signal. While the equations shown in FIGS. 3A-3H are for an 8-bit wide counter, it will be appreciated that these equations could readily be extended for other width counters such as 16, 32, 64, or 128 bit wide counters.

More specifically, FIG. 3A shows the combinatorial equation for the up count portion of the bit 7 counter circuit 224. FIG. 3B shows the combinatorial equation for the up count portion of the bit 6 counter circuit 222. FIG. 3C shows the combinatorial equation for the up count portion of the bit 5 counter circuit 220. FIG. 3D shows the combinatorial equation for the up count portion of the bit 4 counter circuit 218. FIG. 3E shows the combinatorial equation for the up count portion of the bit 3 counter circuit 216. FIG. 3F shows the combinatorial equation for the up count portion of the bit 2 counter circuit 214. FIG. 3G shows the combinatorial equation for the up count portion of the bit 1 counter circuit 212. FIG. 3H shows the combinatorial equation for the up count portion of the bit 0 counter circuit 210.

The lettering and combinatorial conventions are consistent across FIGS. 3A-3H. Accordingly, with the bit 7 count circuit 224, the new up counter bit 7 (up c7*) is equal to the inverse of the present counter bit 7 (c7'). With the bit 6 count circuit 222, the new up counter bit 6 (up c6*) is equal to (bit 6 of the present counter signal AND the inverse of bit 7 of the present counter signal) OR (the inverse of bit 6 of the present counter signal AND bit 7 of the present counter signal). With the bit 5 counter circuit 220, the new up counter bit 5 (up c5*) is equal to bit 5 of the present counter signal AND the variable w0) OR (the inverse of bit 5 of the present counter signal AND the variable x0). Where the variable w0 is equal to the inverse of bit 6 of the present count signal OR bit 7 of the present count signal and the variable x0 is equal to bit 6 of the present count signal AND bit 7 of the present count signal. Similarly, up count bits 4-0 are computed according to their respective combinatorial equations.

Referring to FIGS. 4A-4H, the combinatorial equations for implementing respective bits of the next down count circuit 132 are shown. By using the counter bits generated by these combinatorial equations, the counter 100 uses the current state of the counter along with the down clock pulse to generate a new count signal. While the equations shown in FIGS. 4A-4H are for an 8-bit wide counter, it will be appreciated that these equations could readily be extended for other width counters such as 16, 32, 64, or 128 bit wide counters.

More specifically, FIG. 4A shows the combinatorial equation for the down count portion of the bit 7 counter circuit 224. FIG. 4B shows the combinatorial equation for the down count portion of the bit 6 counter circuit 222. FIG. 4C shows the combinatorial equation for the down count portion of the bit 5 counter circuit 220. FIG. 4D shows the combinatorial equation for the down count portion of the bit 4 counter circuit 218. FIG. 4E shows the combinatorial equation for the down count portion of the bit 4 counter circuit 216. FIG. 4F shows the combinatorial equation for the down count portion of the bit 2 counter circuit 214. FIG. 4G shows the combinatorial equation for the down count portion of the bit 1 counter circuit 212. FIG. 4H shows the combinatorial equation for the down count portion of the bit 0 counter circuit 210.

The lettering and combinatorial conventions are consistent across FIGS. 4A-4H. For example, with the bit 7 counter circuit 224, the new down counter bit 7 (down c7*) is equal to the inverse of the present counter bit 7 (c7'). With the bit 6 counter circuit 222, the new down counter bit 6 (down c6*) is equal to (bit 6 of the present counter signal AND bit 7 of the present counter signal) OR (the inverse of bit 6 of the present counter signal AND the inverse of bit 7 of the present counter signal). With the bit 5 counter circuit 220, the new down counter bit 5 (down c5*) is equal to (bit 5 of the present counter signal AND the variable y0) OR (the inverse of bit 5 of the present counter signal AND the variable z0), where the variable y0 is equal to bit 6 of the present count signal OR bit 7 of the present count signal and the variable z0 is equal to the inverse of bit 6 of the present count signal AND the inverse of bit 7 of the present count signal. Similarly, down count bits 4-0 are computed according to their respective combinatorial equations.

Figure 5:
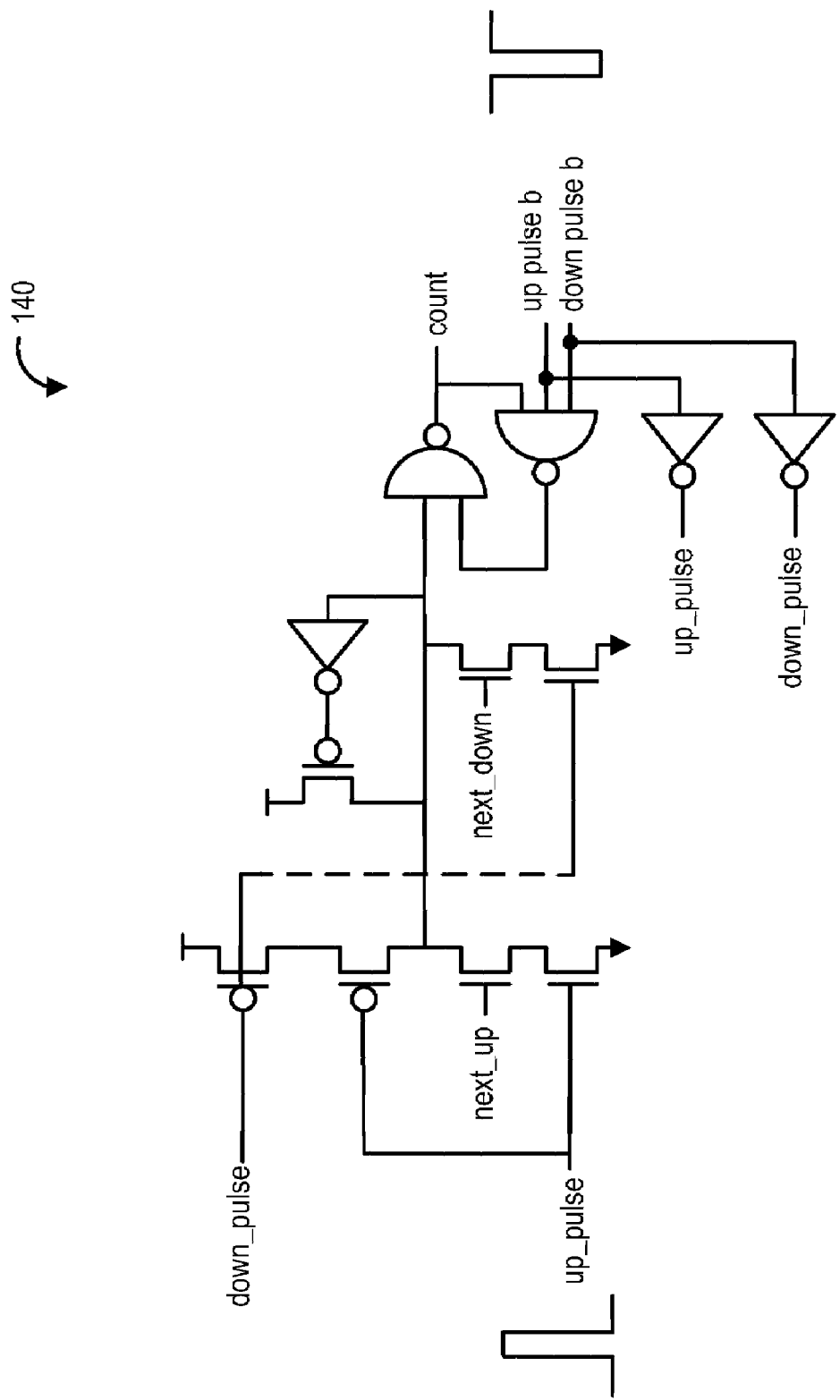
FIG. 5 shows a schematic block diagram of a precharge latch of the counter.

Referring to FIG. 5, one implementation of a dynamic bit latch 140 is shown. By using the scan feature as a second control pre-charge PFET. Within the dynamic bit latch, two pull down trees will provide an up/down OR-ing structure. Additionally, the final value (i.e., the next up or next down bits) is latched based on the trigger of an up/down pulse.

The up pulse signal and the down pulse signal latch the appropriate next bit of the particular bit within the up/down counter as shown in FIGS. 3$a$-3$h$ and 4$a$-4$h$. When the next count bits have been computed, these bits feed into a respective gate of the next_up transistor and the next_down transistor. Depending on which pulse is received by the dynamic bit latch 140, either the next up value or the next down value latches into the cross coupled NAND gates. The Up pulse b and down pulse b signals cause the cross couple NAND latch to open so that the latch can accept the incoming data.

It will be appreciated that any control circuit could generate the up and down pulses to change the status quo of the counter. In the bit latch 140, these pulses should be active orthogonally (i.e. only one pulse is active at once) for the counter 100 to operate properly. A pulsed output phase detector is an example of a control circuit that could generate the up and down pulses.

Figure 6:
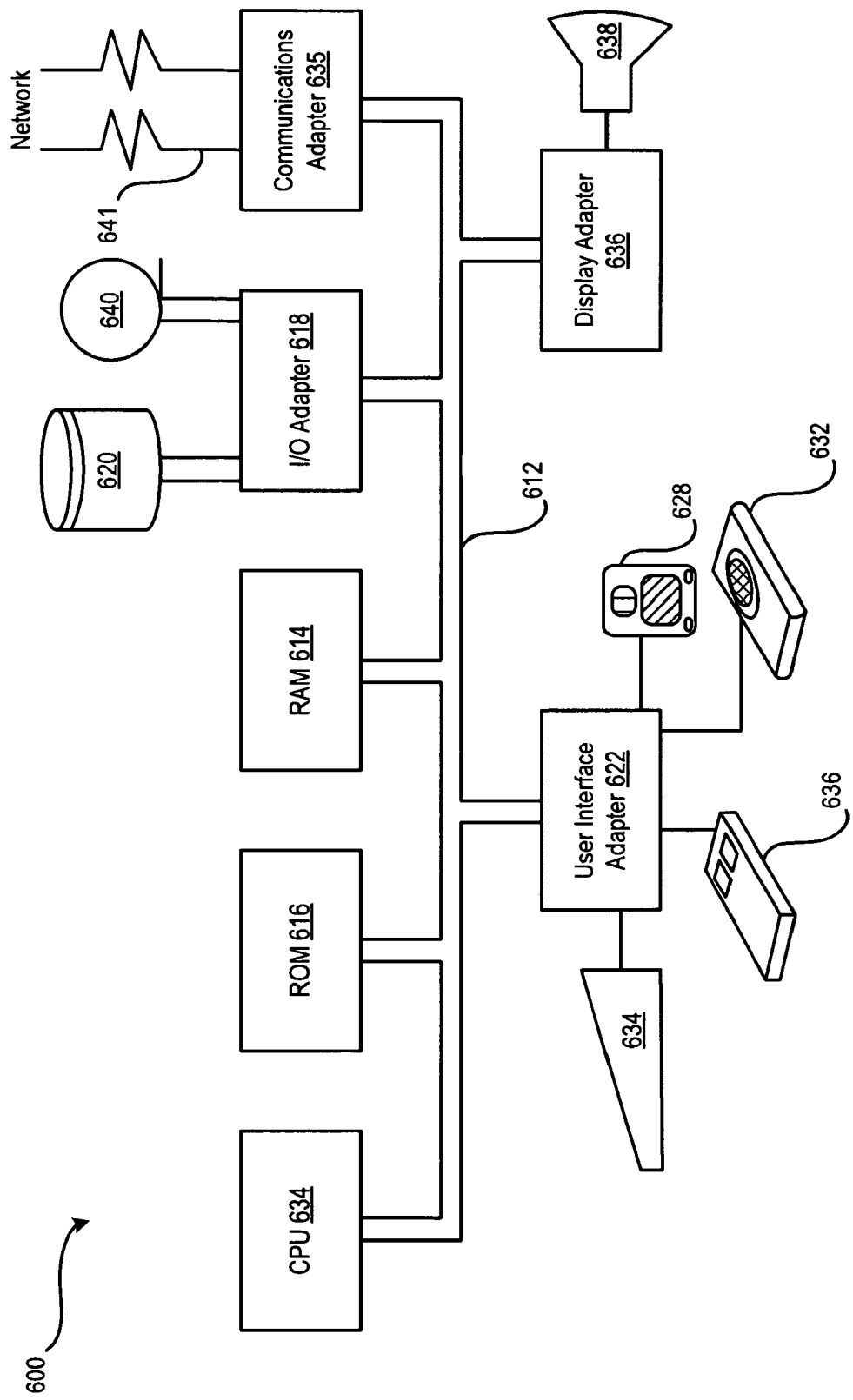
FIG. 6 shows a block diagram of a data processing system suitable for practicing embodiments of the present invention.

FIG. 6 is a high level functional block diagram of a representative data processing system 600 suitable for practicing the principles of the present invention. Data processing system 600 includes a central processing system (CPU) 610 operating in conjunction with a system bus 612. System bus 612 operates in accordance with a standard bus protocol, such as the ISA protocol, compatible with CPU 634. CPU 634 operates in conjunction with electronically erasable programmable read-only memory (EEPROM) 616 and random access memory (RAM) 614. Among other things, EEPROM 616 supports storage of the Basic Input Output System (BIOS) data and recovery code. RAM 614 includes DRAM (Dynamic Random Access Memory) system memory and SRAM (Static Random Access Memory) external cache. I/O Adapter 618 allows for an interconnection between the devices on system bus 612 and external peripherals, such as mass storage devices (e.g., a hard drive, floppy drive or CD/ROM drive), or a printer 640. A peripheral device 620 is, for example, coupled to a peripheral control interface (PCI) bus, and I/O adapter 618 therefore may be a PCI bus bridge. User interface adapter 622 couples various user input devices, such as a keyboard 624 or mouse 626 to the processing devices on bus 612. Display 638 which may be, for example, cathode ray tubes (CRT), liquid crystal display (LCD) or similar conventional display units. Display adapter 636 may include, among other things, a conventional display controller and frame buffer memory. Data processing system 600 may be selectively coupled to a computer or telecommunications network 641 through communications adapter 634. Communications adapter 634 may include, for example, a modem for connection to a telecom network and/or hardware and software for connecting to a computer network such as a local area network (LAN) or a wide area network (WAN). CPU 634 and other components of data processing system 600 may contain counter circuits according to embodiments of the present invention.

Although the present invention and its advantages have been described in detail, it should be understood that various changes, substitutions and alterations can be made herein without departing from the spirit and scope of the invention as defined by the appended claims.

For example other combinations of the next count circuit and the latch circuit are within the scope of the invention. For example, FIGS. 7A-7H show combinatorial equations for logic in which the next count circuit and the latch circuit are combined when producing a new count signal. Also, as shown in FIGS. 7A-7H, a single next count signal can be generated which counts both up and down based upon whether an up pulse is received by the counter or a down pulse is received by the counter.

As will be appreciated by one skilled in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium.

As will be appreciated by one skilled in the art, while the present invention, and circuits within the present invention are described using certain combinations of logic, other logic combinations are also within the scope of the invention. For example, it will be appreciated that other logic combinations to provide a delay circuit and a stretching circuit are known. Also, it will be appreciated that changing the polarity of the logic gates, e.g., from AND to NAND, are also within the scope of the invention. Also, it will be appreciated that any circuits that perform the delay and stretching function are within the scope of the invention.

The block diagrams in the Figures illustrate the architecture, functionality, and operation of possible implementations of systems and methods according to various embodiments of the present invention. It will also be noted that each block of the block diagrams, and combinations of blocks in the block diagrams, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A counter comprising:
   a next count circuit, the next count circuit generating a parallel next count signal based upon a present count value, the next count circuit comprising a plurality of bit counter circuits, each of the plurality of bit counter circuits generating a bit of the parallel next count signal in parallel, each of the plurality of bit counter circuits generating a bit of the parallel next count signal based upon a combinatorial equation corresponding to the bit of the parallel next count signal; and,
   a latch circuit, the latch circuit latching the parallel next count signal based upon whether an up count indication or a down count indication is received by the latch circuit.

2. The counter of claim 1 wherein:
   the parallel next count signal comprises a parallel next up count signal and a parallel next down count signal; and,
   the latch circuit latching one of the parallel next up count signal and the parallel down count signal based upon whether an up count indication or a down count indication is received.

3. The counter of claim 2 wherein:
   the parallel next count signal comprises an up count circuit and a down count circuit, the up count circuit generating the next up count signal and the down count circuit generating the next down count signal.

4. The counter of claim 1 wherein:
   each combinatorial equation is based upon previous values of less significant bits of the parallel next count signal.

5. The counter of claim 1 wherein:
   the latch circuit comprises a plurality of bit latches, each of the plurality of bit latches latching a bit of the parallel next count signal in parallel.

6. A method for generating a count comprising:
   generating a parallel next count signal based upon a present count value, the parallel next count signal comprises a plurality of bits;
   latching the parallel next count signal based upon whether an up count indication or a down count indication is received by a latch circuit; and,
   simultaneously generating the plurality of bits of the parallel next count signal, the simultaneously generating being based upon a combinatorial equation corresponding to each bit of the parallel next count signal.

7. The method of claim 6 wherein:
   the parallel next count signal comprises a parallel next up count signal and a parallel next down count signal; and further comprising,
   latching one of the parallel next up count signal and the parallel down count signal based upon whether an up count indication or a down count indication is received.

8. The method of claim 7 wherein:
   simultaneously generating the next up count signal and the next down count signal.

9. The method of claim 6 wherein:
   each combinatorial equation is based upon previous values of less significant bits of the parallel next count signal.

10. The method of claim 6 wherein:
    the parallel next count signal comprises a plurality of bits; and further comprising
    latching each of the plurality of bits of the parallel next count signal in parallel.

11. A counter comprising:
    a parallel next count circuit, the parallel next count circuit comprising a plurality of bit counter circuits, each of the plurality of bit counter circuits generating a bit of a parallel next count signal in parallel, each of the plurality of bit counter circuits generate a bit of the parallel next count signal based upon a combinatorial equation corresponding to the bit of the parallel next count signal; and,
    a latch circuit, the latch circuit comprising a plurality of bit latches, each of the plurality of bit latches latching a bit of the parallel next count signal in parallel.

12. The counter of claim 11 wherein:
    the parallel next count signal comprises a parallel next up count signal and a parallel next down count signal; and,
    the latch circuit latches one of the parallel next up count signal and the parallel down count signal based upon whether an up count indication or a down count indication is received.

13. The counter of claim 12 wherein:
    the parallel next count signal comprises an up count circuit and a down count circuit, the up count circuit generating the next up count signal and the down count circuit generating the next down count signal.

14. The counter of claim 11 wherein:
    each combinatorial equation is based upon previous values of less significant bits of the parallel next count signal.

* * * * *